United States Patent [19]

Schneider

[11] 4,001,674
[45] Jan. 4, 1977

[54] METHOD OF TESTING THE VOLTAGE WITHSTAND ABILITY OF A HIGH VOLTAGE D-C CABLE AT A VOLTAGE HIGHER THAN ITS NORMAL OPERATING VOLTAGE WHILE CARRYING CURRENT

[75] Inventor: Harold N. Schneider, Springfield, Pa.

[73] Assignee: General Electric Co., Philadelphia, Pa.

[22] Filed: July 29, 1975

[21] Appl. No.: 600,034

[52] U.S. Cl. .............................................. 324/54
[51] Int. Cl.² .................................... G01R 31/12
[58] Field of Search ....................... 324/54, 51, 52

[56] References Cited

UNITED STATES PATENTS

| | | | |
|---|---|---|---|
| 2,701,336 | 2/1955 | Anderson | 324/54 |
| 3,364,420 | 1/1968 | Kreuger | 324/54 |
| 3,373,353 | 3/1968 | Harris | 324/54 |
| 3,421,076 | 1/1969 | Eigen | 324/54 |
| 3,466,537 | 9/1969 | Eigen | 324/54 |
| 3,821,640 | 6/1974 | Bahder et al. | 324/54 |
| 3,909,712 | 9/1975 | Rietz et al. | 324/52 |
| 3,919,635 | 11/1975 | Bowen et al. | 324/54 |

*Primary Examiner*—Gerard R. Strecker
*Attorney, Agent, or Firm*—William Freedman

[57] ABSTRACT

A high voltage d-c cable is tested by first disconnecting the normally-grounded sheath of the cable from ground and providing insulation between the sheath and ground. The sheath is then biased to a predetermined bias voltage that is of an opposite polarity with respect to ground as the normal operating voltage of the cable conductor. The conductor is then energized with current and test voltage derived from its normal source. This test voltage is of the same polarity with respect to ground as the normal operating voltage of the cable conductor and of a magnitude approximating said normal operating voltage, whereby the difference between said test voltage and said bias voltage is applied to the cable insulation between the cable conductor and sheath.

3 Claims, 3 Drawing Figures

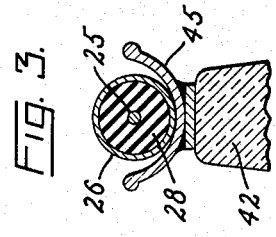
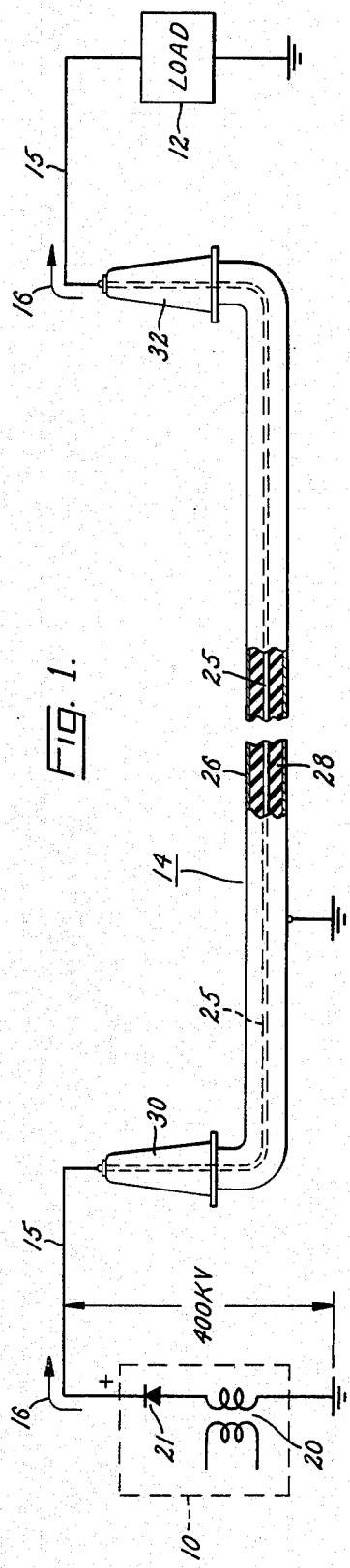
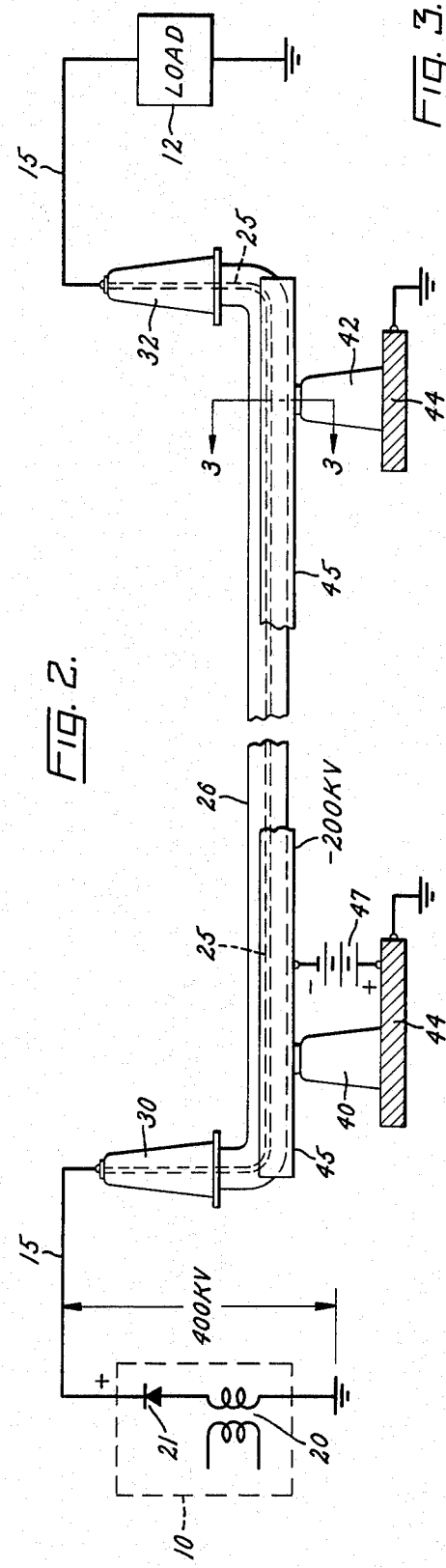

METHOD OF TESTING THE VOLTAGE WITHSTAND ABILITY OF A HIGH VOLTAGE D-C CABLE AT A VOLTAGE HIGHER THAN ITS NORMAL OPERATING VOLTAGE WHILE CARRYING CURRENT

BACKGROUND

The invention relates to a method of testing the insulation of a high-voltage d-c cable and, more particularly, to a method of testing the ability of such insulation to withstand a voltage higher than the normal operating voltage of said cable while the cable is carrying high continuous currents.

The usual high-voltage d-c cable comprises a conductor that is normally operated at a predetermined voltage with respect to ground, a metal sheath surrounding the conductor that is normally at ground potential, and dielectric material between the conductor and sheath that is stressed by the voltage present between the conductor and sheath. It is sometimes necessary that this insulation be tested at a voltage considerably higher than the normal operating voltage. To make such test more meaningful, it is sometimes also necessary that this higher voltage be applied to the insulation for an extended period and, particularly, for an extended period while the cable is carrying high continuous currents.

A possible energization source for providing the desired current and voltage for such testing is the source of the system in which the cable is normally connected. While such a source can provide the desired current, it usually cannot supply the full higher voltage that is desired. It is possible to add a supplemental source in series with the main source to provide a higher total voltage, but this approach has certain disadvantages. First of all, the supplemental source can be relatively expensive; and, secondly, the entire system, rather than only the cable, is exposed to the higher total voltage of the modified source, and this could lead to a damaging failure in some part other than the cable.

SUMMARY

An object of my invention is to test the insulation of the cable at a voltage higher than its normal operating voltage while the cable is carrying current derived from its normal source of energization.

Another object is to carry out such a test in a power system including the cable without exposing components of the system other than the cable to the aforesaid higher voltage.

Still another object is to attain the above two objects without need for a supplemental source that is required to carry the normal continuous current of the system.

In carrying out the invention in one form, I test the insulation of a cable of the above-described type by first disconnecting the normally-grounded cable sheath from ground and providing insulation between said sheath and ground. I then electrically bias the sheath to a predetermined bias voltage that is of an opposite polarity with respect to ground as the normal operating voltage of the cable conductor. The conductor is then energized with current and test voltage derived from its normal source of energization, this test voltage being of the same polarity with respect to ground as the normal operating voltage of the cable conductor and of a magnitude approximating said normal operating voltage. The result is that the difference between said test voltage and said bias voltage is applied to the cable insulation between the cable conductor and the sheath.

BRIEF DESCRIPTION OF THE DRAWINGS

FIG. 1 shows a high voltage d-c system including a cable that it is desired to test at a higher voltage than its normal operating voltage.

FIG. 2 illustrates a test method embodying one form of my invention for applying the aforesaid high voltage to the cable of FIG. 1.

FIG. 3 is a cross sectional view along the line 3—3 of FIG. 2.

DETAILED DESCRIPTION OF PREFERRED EMBODIMENT

Referring now to FIG. 1, the high voltage d-c system shown therein comprises a high voltage d-c source 10, a load 12, and a power line including a cable 14 for transmitting high voltage direct current from the source to the load. It will be assumed that normal continuous current flows in the direction indicated by the arrows 16, returning to the source through ground. The source 10 is schematically depicted as comprising a transformer 20 and a rectifier 21 connected in series with the secondary winding of the transformer. The positive terminal of source 10 is connected to power line 15 and its negative terminal to ground. Similarly, the load 12 is connected between power line 15 and ground.

As shown in the drawing, especially FIG. 3, the cable 14 comprises a conductor 25 that is normally operated at a predetermined high voltage with respect to ground, a metal sheath 26 normally at ground potential surrounding the conductor in radially-spaced relationship thereto, and dielectric material 28 filling the space between the conductor 25 and the sheath 26. Although the insulation 28 is shown as a solid material, it can be of a liquid or a gas or a combination of any of these materials. At opposite ends of the cable and constituting a part of the cable, there are two potheads 30 and 32, each of a conventional design for supporting the ends of the conductor 25 and for electrically insulating these ends from the grounded sheath 26.

It will be assumed, by way of example and not limitation, that the source develops a voltage of about 400kv between its terminals and that the normal operating voltage of the cable is +400kv, as measured between high voltage conductor 25 and the grounded sheath 26. It may sometimes be desired to test the cable at a much higher voltage, e.g., 600kv, to determine whether its insulation can withstand such a voltage without damage. It may also be desired to determine whether this higher voltage can be withstood for an extended period, particularly, for an extended period while the cable is carrying high continuous currents.

I perform such a test by first disconnecting the cable sheath from ground and supporting it on a plurality of spaced insulators 40 and 42. To provide for such support of the cable, a horizontally-extending metal trough 45 is fixed to the top of the insulators 40 and 42 for receiving the cable. When the test is to be made, the cable is simply lifted from its position of FIG. 1 and placed within this trough. Suitable fastening devices (not shown) are provided for securing the cable sheath to the trough in order to adequately support the cable during this test. The lower ends of the insulators 40 and 42 are suitably connected to grounded structure 44. Next, a suitable voltage source 47 is connected between the trough and ground. In the illustrated embodiment, this voltage source 47 provides a voltage between its terminals of 200kv. The upper terminal of source 47 is negative with respect to its lower terminal, thus placing the trough 45 at a voltage of −200kv with respect to ground. This voltage is referred to herein as a bias voltage. Since the metal sheath 26 of the cable is in contact with the trough, it too is at a potential of −200kv with respect to ground. Since the conductor 25 of the cable is energized by source 10 at a potential of +400kv with respect to ground, the total voltage present between conductor 25 and sheath 26 of the cable is the difference between +400kv and −200kv, or 600kv. The voltage applied by source 10 with respect to ground is referred to hereinafter as a test voltage.

Assuming no dielectric breakdown, the above-described difference voltage of 600kv between the conductor 25 and the sheath 26 can be maintained indefinitely and, moreover, can be maintained while rated continuous current is being supplied by source 10 to the cable conductor 25. This current and voltage condition subjects the insulation 28 to the desired thermal and dielectric stresses, thus enabling the desired testing of the insulation to be carried out. Suitable instrumentation (not shown) is provided for monitoring the condition of the cable insulation, e.g., by detecting any dielectric breakdown within the insulation during the test. The output from such instrumentation can be used to trigger open a circuit breaker (not shown) in series with the primary winding of transformer 20 to deenergize the source 10 in the event of such a dielectric breakdown.

An important advantage of my testing method is that I subject only the test object, i.e., the cable 14 (including potheads 30 and 32), to the higher voltage, i.e., the desired 600kv. The rest of the power system remains in FIG. 2 just as it was in FIG. 1 and thus is subject only to the same voltage stresses as are present in FIG. 1. It is assumed in the above discussion that the potheads 30 and 32 are adequate to withstand the full difference voltage.

It will be apparent that the source 47 for the bias voltage can be of a relatively inexpensive construction inasmuch as this source is not required to carry any significant amount of current. A suitable construction for this source is the series combination of a transformer and a rectifier connected in series with the transformer secondary in generally the same manner as in the normal source 10.

By making minor modifications in the biasing source 47, one can readily test the cable 14 for its ability to withstand other types of voltage conditions in addition to that specifically described hereinabove. For example, it is possible to make the bias source a source of a.c. voltage and thus to apply to the cable insulation the voltage of the normal source 10 with the a.c. voltage of such a modified bias source superimposed thereon. Under these conditions, the load 12 would be subjected only to the normal source voltage, as desired. It is also possible to reverse the polarity of both sources 10 and 47 and apply the resulting 600kv across the cable insulation with the sheath 26 positive and the conductor 25 negative.

While I have shown and described a particular embodiment of my invention, it will be obvious to those skilled in the art that various changes and modifications may be made without departing from my invention in its broader aspects; and I, therefore, intend in the appended claims to cover all such changes and modifications as fall within the true spirit and scope of my invention.

What I claim as new and desire to secure by Letters Patent of the United States is:

1. A method of testing a high voltage d-c cable at a voltage higher than its normal operating voltage while said cable is carrying current from its normal source of energization, said d-c cable comprising: a conductor for carrying said current that is normally operated at a predetermined voltage and polarity with respect to ground, a metal sheath surrounding said conductor that is normally at ground potential, and dielectric material between said conductor and said sheath that is stressed by the voltage present between said conductor and said sheath, said method comprising the steps of:
   a. disconnecting said sheath from ground and providing insulation between said sheath and ground,
   b. electrically biasing said sheath to a predetermined bias voltage with respect to ground, said bias voltage being of an opposite polarity with respect to ground as the normal operating voltage of said source,
   c. energizing said conductor with current and test voltage derived from said normal source, said test voltage being of the same polarity with respect to ground as said normal operating voltage and of a magnitude approximating that of said normal operating voltage, whereby the difference between said test voltage and said bias voltage is applied to said dielectric material, and
   d. monitoring the condition of said dielectric material after said conductor has been energized as in (c) and said difference voltage has been applied to said dielectric material so as to determine whether said dielectric material can withstand said difference voltage without a breakdown while said conductor is carrying said current.

2. The method of claim 1 in which said cable is placed in a support mounted on said insulation prior to electrically biasing said sheath to said predetermined voltage.

3. The method of claim 1 in which said test is performed in a system comprising said source and a load connected in series with said cable, said source and said load being subjected during said test to only said test voltage and not to the difference between said test voltage and said bias voltage.

* * * * *